United States Patent [19]

Hill

[11] Patent Number: 5,010,576
[45] Date of Patent: Apr. 23, 1991

[54] ACTIVE ACOUSTIC ATTENUATION SYSTEM FOR REDUCING TONAL NOISE IN ROTATING EQUIPMENT

[75] Inventor: Peter D. Hill, Monroeville, Pa.

[73] Assignee: Westinghouse Electric Corp., Pittsburgh, Pa.

[21] Appl. No.: 468,329

[22] Filed: Jan. 22, 1990

[51] Int. Cl.$^5$ .................................. G10K 11/16
[52] U.S. Cl. .................................. 381/71
[58] Field of Search .................. 381/71; 328/28; 307/261, 354

[56] References Cited

U.S. PATENT DOCUMENTS

| | | | |
|---|---|---|---|
| 3,502,911 | 3/1970 | Lehman | 328/28 |
| 4,473,906 | 9/1984 | Warnaka et al. | |
| 4,506,380 | 3/1985 | Matsui | 381/71 |
| 4,677,677 | 6/1987 | Eriksson | |

FOREIGN PATENT DOCUMENTS 2201858 9/1988 United Kingdom .

OTHER PUBLICATIONS

Samuel D. Stearns, Adaptive Signal Processing, Prentice Hall, Inc., 1985, pp. 288–292.
G. H. Koopmann et al., Active Source Cancellation of the Blade Tone Fundamental and Harmonics in Centrifugal Fans, Journal of Sound and Vibration, Academic Press Limited, 1988, pp. 209–220.
IBM Technical Disclosure Buleltin, "Audible Noise Suppression," vol. 31, No. 8, Jan. 1989, pp. 256–258.

Primary Examiner—Jin F. Ng
Assistant Examiner—Sylvia Chen
Attorney, Agent, or Firm—G. H. Telfer

[57] ABSTRACT

An active acoustic attenuation system for attenuating tonal blade pass noise in a multi-bladed fan uses a sinusoidal rotational speed signal produced by an accelerometer mounted on the fan as the reference signal for a filtered-X LMS (least mean squarae) adaptive filter controlling a canceling sound generating speaker. The sinusoidal signal is clipped by a zero crossing detector to produce a rectangular wave signal having harmonics which include the fundamental and harmonics of the tonal noise to be eliminated. When the system is used with axial flow fans having a central hub, the speaker is mounted facing the fan and coaxial with the hub. When the fan has a straight discharge conduit, the speaker is no larger in diameter than the fan hub to preclude restricting flow; however, there is no restriction on the size of a speaker facing the fan when it is mounted in the rear wall of a discharge chamber having a lateral discharge opening.

24 Claims, 2 Drawing Sheets

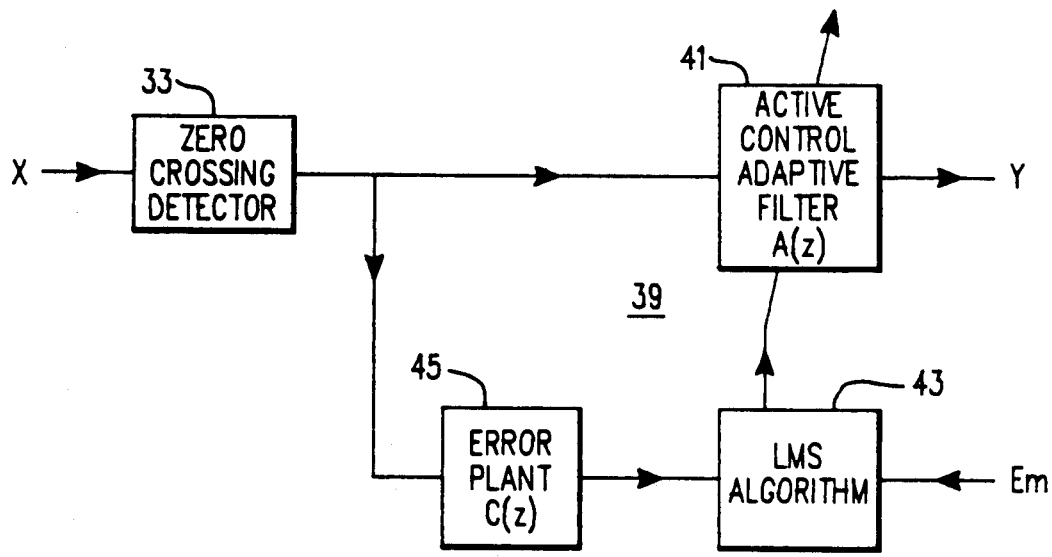
FIG. 2
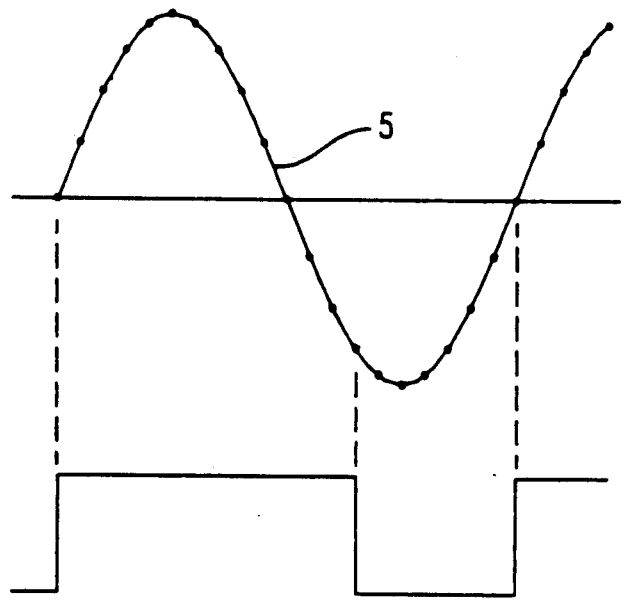
FIG. 3A
FIG. 3B

ACTIVE ACOUSTIC ATTENUATION SYSTEM FOR REDUCING TONAL NOISE IN ROTATING EQUIPMENT

BACKGROUND OF THE INVENTION

1. Field of the Invention

This invention relates to active acoustic attenuation systems which reduce noise by generating canceling sound substantially equal in magnitude but opposite in phase to the noise, and in particular to such systems for reducing tonal noise produced by small cooling fans for electronic equipment such as computers

2. Background Information

Many computers and other electronic equipment use forced ventilation as a means of cooling the electronic components. The primary complaint from computer operators is that the ventilation fans produce annoying tones. One solution places the operators in a separate room from the computer. However, with the advent of the personal computer and the workstation, the operator must be near the device Fan noise originates from two sources. The first source is the turbulent flow of air as it is exhausted by the fan. This noise is random and can be reduced by proper fan and grill design. The second source of noise is called blade pass noise. As the fan blade passes a nearby support, a pressure wave is produced. Since the fan rotates at a constant speed, a periodic sequence of pressure waves produces a fundamental tone plus higher order harmonics.

Common solutions to fan noise control involve the use of sound absorption devices and repositioning of the fans. Intake and exhaust silencers reduce the noise produced by fans; however, these solutions sacrifice airflow, i.e., reduce cooling, for noise reduction.

Active control of noise in enclosed systems such as ducts has been known for sometime. In this type of noise control, a destructive interference pattern is generated by a speaker positioned near the noise source, which radiates a signal that is 180 degrees out of phase with the noise. The signal from the speaker cancels the noise. Often, the source noise is sampled by an input microphone to generate an input reference and the resultant sound produced by the combination of the canceling wave from the speaker with the noise is sampled by an error microphone. The difference between the two sampled sounds is used to generate the signal driving the speaker. Typically, the control system which generates the speaker signal utilizes an adaptive filter which accommodates for the time required for sound to propagate from the source and from the speaker to the error microphone. A common type of adaptive filter used in this application is the LMS (least means square) adaptive filter. An example of such a filter is described in U.S. Pat. No. 4,473,906. A modification of this filter is the filtered-X LMS adaptive filter which overcomes difficulties in obtaining convergence of the adaptive filter to control tonal noise in the presence of broad band noise. Such a filtered-X LMS adaptive filter is described by Bernard Widrow and Samuel D Stearns in *Adaptive Signal Processing*, Prentice-Hall, Inc., 1985, pp 288–292.

Active control systems which use the source noise as an input reference signal must contend with feedback from the speaker to the input microphone. Where fan blade pass noise is to be attenuated, this problem can be avoided by using a signal representative of the rotational speed of the fan as the input reference signal for the control system, as noted in U.S. Pat. No. 4,677,677. An experimental system which uses a toothed wheel and an optical detector to generate a square wave signal from which the blade passing frequency can be derived is described by G. H. Koopmann and D. J. Fox, in *Active Source Cancellation of the Blade Tone Fundamental and Harmonics in Centrifugal Fans Journal of Sound and Vibration*, Academic Press Limited, 1988, pp 209–220. That system, however, uses two 2-channel phase shifting phase locked loops to generate signals for two speakers used to attenuate the fundamental frequency and only one selected harmonic of the blade pass noise in a centrifugal fan. Microphones are used only to monitor the resultant sound and not to control the phase locked loops which must be manually adjusted.

There is a need for an improved active acoustic attenuation system for attenuating tonal noise generated by rotating equipment.

There is a further need for such a system which attenuates the fundamental and all harmonics of tonal noise generated by the fans.

There also is a need for such a system which can be implemented economically.

SUMMARY OF THE INVENTION

These and other needs are satisfied by the invention which is directed to an active acoustic attenuation system for attenuating tonal noise associated with rotating apparatus including means generating a sinusoidal reference signal having a frequency representative of the rotational speed of the apparatus. The invention is particularly applicable to fans having multiple blades which produce blade pass tonal noise having a fundamental frequency which is a multiple of the fan rotational speed, and harmonics thereof.

In accordance with one aspect of the invention, the sinusoidal reference signal is generated by an accelerometer which detects imbalance in the rotating fan. Preferably, the sinusoidal signal is passed through a low pass filter having a cut-off frequency only slightly higher than the frequency of the sinusoidal signal. The filtered sinusoidal signal eliminates the effects of broadband noise such as that generated by turbulent flow and other noise such as bearing noise. Since a fan has several blades, the filter cutoff frequency is below the fundamental frequency of the blade pass noise, let alone the harmonics. However, a signal containing the fundamental frequency and harmonics of the blade pass noise is generated by clipping the sinusoidal signal. Preferably, the clipping is effected by a zero crossing detector which produces a rectangular wave signal having a fundamental frequency equal to the rotational speed of the fan. A rectangular wave with other than a 50% duty cycle is needed so that the harmonics of the clipped sinusoidal speed signal include the fundamental frequency of the tonal noise and its harmonics. Such an unbalanced rectangular wave can be generated by the zero crossing detector by delaying the change of state of the rectangular signal for zero crossings in one direction.

Canceling means in the form of a speaker spaced from the fan generates canceling sound which combines with and attenuates the fundamental frequency and harmonics of the tonal noise. The clipped sinusoidal signal is applied, together with an error signal produced by a microphone which picks up the combined sound of the fan and the speaker, to an electronic controller which drives the speaker. An analog to digital converter digitizes the sinusoidal signal for input to the electronic controller in the form of a digital computer which is programmed to implement the zero crossing detector which clips the sinusoidal signal and to implement the adaptive filter. In the exemplary system the adaptive filter is a filtered-X least means square (LMS) adaptive filter.

As applied to an axial flow fan with a central hub, the acoustic attenuation system of the invention includes mounting the speaker coaxially with the fan hub. In the case of a fan with a coaxial discharge conduit, the speaker is mounted in the conduit spaced from, but coaxially with and facing, the fan. Where the fan has a discharge chamber with a lateral opening, the speaker is mounted in a rear laterally extending wall spaced from the fan by the lateral opening, with the speaker coaxially aligned with and facing the fan. In this latter configuration, the speaker can be larger in lateral dimension than the hub without at all restricting the flow of air discharged by the fan.

BRIEF DESCRIPTION OF THE DRAWINGS

A full understanding of the invention can be gained from the following description of the preferred embodiments when read in conjunction with the accompanying drawings in which:

FIG. 2 is a diagram in block form of the program for the electronic controller which forms a part of the system of FIG. 1.

FIG. 3A is a plot of the sinusoidal reference signal produced by an accelerometer used by the system of the invention.

FIG. 3B is a plot of a rectangular wave signal produced by clipping the sinusoidal signal of FIG. 3A in accordance with the invention so that the rectangular wave signal does not have a 50% duty cycle.

DESCRIPTION OF THE PREFERRED EMBODIMENTS

Figure 1:
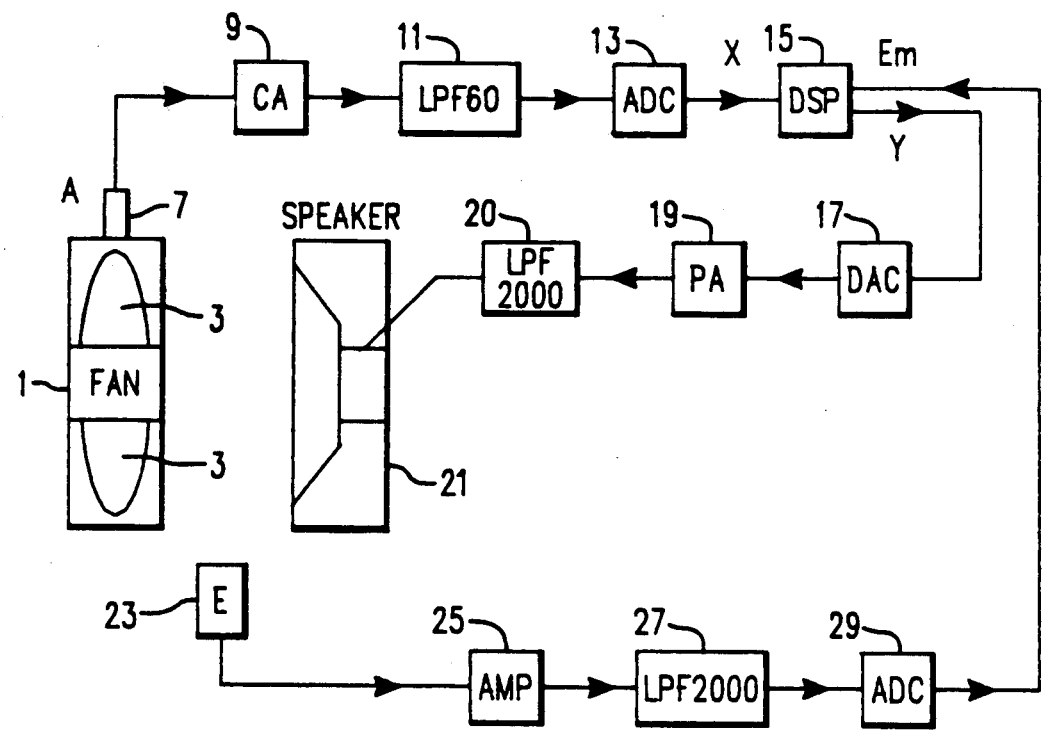
FIG. 1 is a schematic diagram in block form of an active acoustic attenuation system for a fan in accordance with the invention.

The invention will be described as applied to an axial flow fan 1 as shown in FIG. 1, however, those skilled in the art will realize that the invention has application to other types of rotating apparatus which generate tonal noise. The fan 1 has a plurality of blades 3 which can produce blade pass noise as the blades successively pass a nearby support. The periodic sequence of pressure waves produced as the successive fan blades 3 pass a support produces a fundamental tone and higher order harmonics.

The exemplary fan 1 is an axial flow fan driven by an induction motor energized by 60 Hz ac power. Due to slip inherent in the induction motor, the fan has a rotational speed of 3180 rpm or 53 Hz. The fan 1 has five blades 3 such that the fundamental tone of the blade pass noise has a frequency of 265 Hz with second through fifth harmonics occurring at a 530 Hz, 795 Hz, 1060 Hz, and 1325 Hz, respectively.

The active acoustic attenuation system 5 of the invention includes an accelerometer 7 mounted on the fan 1. The accelerometer responds to the inevitable imbalance of the rotating parts of the fan 1 to generate a sinusoidal signal having a frequency equal to the rotational speed of the fan. In the case of the exemplary fan this is 3180 rpm or 53 Hz. This sinusoidal signal is amplified in a charge amplifier 9 and the amplified sinusoidal signal is passed through a low pass filter 11. The low pass filter 11 has a 60 Hz cutoff frequency to attenuate noise in the accelerometer signal. The filtered sinusoidal signal is applied to an analog to digital converter 13 which digitizes the analog sinusoidal signal for input into a digital signal processor 15. The digital signal processor 15 is a single chip microcomputer such as a Texas Instruments, Inc. TMS320C14 digital signal processor.

The digital signal processor 15 responds to the digitized sinusoidal reference signal, X, and a feedback error signal, $E_m$, to generate a digital signal, Y. The signal Y is converted to an analog signal in digital to analog converter 17, amplified in a power amplifier 19, passed through a low pass filter 20 having a cut-off frequency above a desired harmonic of the tonal noise (for example 2000 Hz) and applied to a speaker 21. As will be discussed more fully later, the speaker 21 is positioned to generate a canceling sound which combines with the sound generated by the fan 1. The canceling sound produced by the speaker contains the fundamental frequency and selected lower harmonics of the tonal noise produced by the fan properly phase shifted and adjusted in magnitude by the digital signal processor 15 to produce a destructive interference pattern with the tonal noise. The combined noise is picked up by an error microphone 23. The error signal generated by the error microphone 23 is amplified in a microphone amplifier 25 and passed through a low pass filter 27. The low pass filter 27 has a cutoff frequency of 2000 Hz such that the fundamental frequency and the major harmonic frequencies of the tonal noise are passed. This filtered signal is digitized in an analog to digital converter 29 to produce the digital error signal $E_m$.

The digital signal processor 15 serves as an electronic controller for generating the cancellation signal, Y, which drives the speaker 21. A microcomputer which serves as the digital signal processor 15 is programmed first to clip the reference signal, X. Clipping of this digitized sinusoidal signal is effected by a zero crossing detector algorithm 33 which converts the sinusoidal signal to a rectangular wave signal having the same fundamental frequency as the sinusoidal signal. As is well known, the rectangular wave signal also contains harmonics of the sinusoidal signal. As will be recalled, the frequency of the sinusoidal signal, and therefore of the rectangular wave signal also, is equal to the frequency of rotation of the fan. However, the fundamental frequency of the tonal noise is a multiple of this frequency determined by the number of fan blades, and hence, corresponds to one of the harmonics of the rectangular wave reference signal. In the exemplary system where the fan has five blades, the fundamental frequency of the tonal noise corresponds to the fifth harmonic of the rectangular wave reference signal It follows then, that the harmonics of the tonal noise are higher order harmonics of the rectangular wave reference signal. Thus, in accordance with the invention, a reference signal having a fundamental frequency of the tonal noise and its significant harmonics but without significant extraneous noise is simply and economically generated using an accelerometer and a zero crossing detector algorithm It should be noted that the rectangular wave signal generated by clipping the sinusoidal speed signal should not be a square wave, that is a rectangular wave with a 50 percent duty cycle, since a square wave only contains odd harmonics of the fundamental square wave signal. A rectangular signal with other than a 50 percent duty cycle contains both odd and even harmonics which are required to assure that the fundamental of the tonal noise and its significant harmonics are present. The zero crossing detector can be adjusted to produce such an unbalanced rectangular wave from a sinusoidal signal by delaying the change of state of the rectangular signal for zero crossings in one direction. This technique as applied to the digitized sinusoidal signal, X, is illustrated by FIGS. 3A and 3B. With the sinusoidal signal, S, going positive, the rectangular wave R goes high at the first sample providing an indication of a zero crossing. However, when the sinusoidal signal is going negative, the rectangular wave signal R does not go low until several samples after the zero crossing. Selection of the delay can be made to adjust the contribution of selected harmonics, however, as will be discussed, the adaptive filter can adjust the gains for the various harmonics as long as they are present.

Returning to FIG. 2, the digital signal processor 15 in addition to clipping the sinusoidal accelerometer signal using the zero crossing detector algorithm 33, also implements the adaptive filter 39, which in the exemplary system is a filtered-X LMS (least means square) filter. Such a filter is described in *Adaptive Signal Processing* referred to above. This filter includes an active control adaptive filter 41 having a transfer function A(z), an LMS algorithm 43 and an error plant 45 with a transfer function C(z). The filter 41 is a transversal filter which uses the reference signal X as clipped by the zero crossing detector 33 to generate the speaker signal Y which drives the speaker 21 to produce sound with the appropriate frequencies and phase shifts to cancel the tonal noise produced by the fan. The LMS algorithm 43 is a least means square algorithm which monitors the error signal, $E_m$, generated by the error microphone 23, and the clipped reference signal, X, and adjusts coefficients in the transversal filter 41 in a manner which produces the least means square error between the fan tonal noise and the output of the speaker 21. The combination of the adaptive transversal filter 41 and the LMS algorithm is known as an LMS adaptive filter. Such a filter is described for instance in U.S. Pat. No. 4,473,906.

The error plant 45 applies the transfer function C(z) to the clipped reference signal, X, to accommodate for the acoustic delays between the speaker 21 and the error microphone 23. Actually, the error plant models the system from the digital to analog converter 17 through the power amplifier 19, the low pass filter 20, the speaker 21, the error microphone 23, the acoustic path between the speaker 21 and the error microphone 23, the amplifier 25, and the low pass filter 27 back to the analog to digital converter 29.

The error plant 45 used is another LMS adaptive filter in which the coefficients are set by generating random noise into the digital to analog converter 17 and into the LMS filter of the error plant. The output of the error plant is compared with the error signal $E_m$, and the difference is used to adapt the filter of the error plant. The error plant filter coefficients then become set at the adapted values.

The error plant 45 shifts the phase of (delays) the clipped reference signal, X, generated from the accelerometer into the same time domain as the error microphone signal. The gradient (the cross-correlation between the output of the error plant and the error signal $E_m$) is then used to update the coefficients of the active control adaptive filter 41. The addition of the error plant 45, makes the LMS adaptive filter comprising 41 and 43 the filtered-X LMS adaptive filter 39.

It may be noted that the clipped reference signal, X, produced by the zero crossing detector 33, contains, in addition to the fundamental of the tonal noise and its harmonics, the fundamental of the sinusoidal accelerometer signal and its other harmonics which do not correspond to the tonal noise fundamental and its harmonics. However, since those frequencies are not in the noise picked up by the microphone, the gains of the active filter 41 for these frequencies will be driven to zero, and thus the speaker will not generate sound at those frequencies. It is the nature of these adaptive filters that the reference signal must contain all of the frequencies that are to be canceled, and other frequencies are attenuate to zero by the filter which adjusts the coefficients for those frequencies to provide a gain of zero. It should also be noted that the relative magnitudes of the fundamental and harmonic frequencies in the reference signal do not have to be the same as in the actual noise, since the coefficients of the filter will adjust to provide the appropriate gain.

Figures 4, 5:
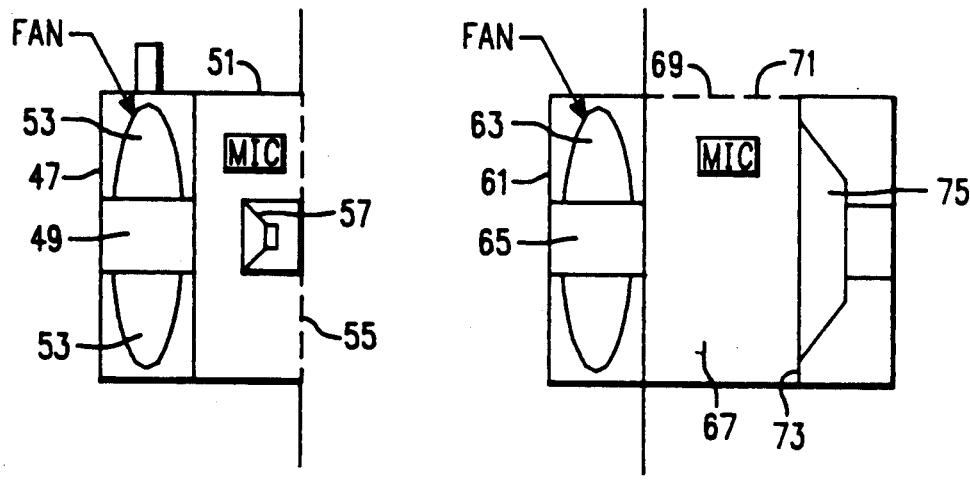
FIG. 4 is a schematic diagram illustrating one configuration of an acoustics attenuation system of the invention as applied to an axial flow fan.
FIG. 5 is a schematic diagram illustrating another configuration of an acoustics attenuation system of the invention as applied to an axial flow fan.

Another aspect of the invention is directed to the placement of the speaker and error microphone. As shown in FIG. 4, the typical small fan used for cooling electronic equipment, is an axial flow fan 47 having a central hub 49 which houses an electric motor (not shown) driving the fan. In the arrangement shown in FIG. 4, a discharge conduit 51 is axially aligned with the fan so that airflow produced by the rotating blades 53 of the fan 47 passes through a grill 55 into the atmosphere. In accordance with this embodiment of the invention, the speaker 57 generating the canceling sound is mounted in the discharge conduit 51 in axial alignment with and facing the hub 49 of the fan 47. It will be noted that the speaker 57 is no larger in diameter than the hub 49 so that it does not interfere with the flow of cooling air through the discharge duct 51. The error microphone 59 is mounted in the discharge conduit 51 where it can pick up the combination of the noise from the fan and the canceling sound from the speaker 57.

FIG. 5 illustrates another embodiment of the invention in which an axial flow fan 61 having blades 63 and an axial hub 65 discharges cooling air into a discharge chamber 67 having a lateral opening 69 covered by a grill 71. In this arrangement, the discharge chamber 67 has a rear wall 73 spaced from the fan 61 by the lateral opening 69. The speaker 75 is mounted in this rear wall 73 facing the fan 61 and axially aligned with the hub 65. This arrangement allows a speaker of any size to be used, including a speaker which is larger in lateral dimension than the hub 65 of the fan, without interferring at all with air flow. The error microphone 77 is placed in the chamber 67 at a location where it can pick up both the fan noise and the canceling sound generated by the speaker.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof

What is claimed is:

1. An active acoustics attenuation system for attenuating tonal noise associated with rotating apparatus, said system comprising:

means generating a sinusoidal signal having a frequency representative of the rotational speed of said apparatus;

means clipping said sinusoidal signal to generate a clipped signal having a fundamental frequency equal to the frequency of said sinusoidal signal and containing harmonics of said fundamental frequency of the sinusoidal signal which include a fundamental frequency and harmonics of said tonal noise;

canceling means adjacent said rotating apparatus and generating canceling sound for combination with, and attenuation of, said fundamental frequency and harmonics of said tonal noise;

error signal generating means spaced from said rotating apparatus and said canceling means detecting said combination of tonal noise and canceling sound and generating an error signal therefrom;

electronic controller means responsive to said clipped signal and said error signal for controlling said canceling means, said electronic controller means including adaptive filter means which accommodates for acoustic delays between the rotating apparatus, the canceling means and the error detecting means; and wherein said means generates a rectangular wave signal having a fundamental frequency equal to the frequency of said sinusoidal signal.

2. The system of claim 1 wherein said rectangular wave signal contains harmonics of the fundamental frequency of said sinusoidal signal including the fundamental frequency and harmonics of said tonal noise.

3. The system of claim 2 including an analog to digital converter digitizing said sinusoidal signal and wherein said means generating said clipped signal and said electronic controller means comprise a digital processor programmed to implement said zero crossing detector and to implement said adaptive filter of said electronic controller means.

4. The system of claim 3 wherein said means generating said sinusoidal signal is an accelerometer.

5. The system of claim 4 wherein said adaptive filter is a filtered-X least mean square adaptive filter.

6. The system of claim 1 wherein said rotating apparatus is a fan having plural fan blades with said tonal noise comprising blade pass noise, said system including a low pass filter filtering said sinusoidal signal, said low pass filter having a cut-off frequency which substantially attenuates frequencies above the fundamental frequency of said sinusoidal signal.

7. The system of claim 6 wherein said means generating said sinusoidal signal is an accelerometer.

8. The system of claim 1 wherein said rotating apparatus comprises an axial flow fan having a central hub from which plural blades project radially, and wherein said cancelling means comprises a speaker axially aligned with said central hub.

9. The system of claim 8 wherein said speaker faces said fan.

10. The system of claim 9 including a discharge conduit into which said fan discharges, said conduit being axially aligned with said fan, and wherein said speaker is mounted inside said discharge conduit axially aligned with and facing said axial flow fan.

11. The system of claim 10 wherein said error signal generator is a microphone located in said discharge conduit between said axial flow fan and said speaker.

12. The system of claim 9 including a discharge chamber into which said axial flow fan discharges, said discharge chamber having a lateral opening and a laterally extending rear wall spaced from said axial flow fan beyond said lateral opening, and wherein said speaker is mounted in said laterally extending rear wall facing said axial flow fan.

13. The system of claim 12 wherein said error signal generating means comprises a microphone mounted in said discharge chamber between said speaker and said axial flow fan.

14. The system of claim 13 wherein said speaker is greater in diameter than said central hub of said axial flow fan.

15. An active acoustic attenuation system for attenuating tonal noise associated with a fan having a plurality of blades, said system comprising:

an accelerometer mounted on said fan and generating a sinusoidal signal having a frequency representative of the rotational speed of said fan;

means clipping said sinusoidal signal to generate a clipped signal having a fundamental frequency equal to the frequency of rotation of said fan and containing harmonic frequencies of the fundamental frequency of said fan speed which include the fundamental frequency and harmonic frequencies of said blade pass tonal noise; speaker means mounted adjacent said fan and generating canceling sound for combination with and attenuation of said fundamental frequency and harmonic frequencies of the blade pass tonal noise of said fan;

an error microphone spaced from said fan and said speaker detecting said combination of tonal noise and canceling sound and generating an error signal therefrom; and electronic controller means responsive to the clipped signal and said error signal for driving said speaker, said electronic controller means including adaptive filter means which accommodates for acoustics delays between said fan, the speaker and the error microphone.

16. The system of claim 15 including an analog to digital converter digitizing said sinusoidal signal and wherein said means generating said clipped signal and said electronic controller means comprise a digital processor programmed to implement a zero crossing detector to clip said sinusoidal signal, and to implement said adaptive filter.

17. The system of claim 16 wherein said zero crossing detector generates a rectangular wave having other than a 50 percent duty cycle.

18. The system of claim 17 wherein zero crossing detector includes means delaying change of state of said rectangular wave in response to zero crossings of said sinusoidal signal in one direction to produce the rectangular wave signal with other than a 50 percent duty cycle.

19. The system of claim 16 including a low pass filter which filters said sinusoidal signal, said low pass filter having a cutoff frequency which substantially attenuates frequencies above the frequency of said sinusoidal signal.

20. The system of claim 19 wherein said adaptive filter is a filtered-X least means square adaptive filter 21. The system of claim 16 wherein said fan is an axial flow fan with a central hub and wherein said speaker faces said axial flow fan and is axially aligned with said central hub.

22. The system of claim 21 including a discharge conduit axially aligned with said axial flow fan and into which said fan discharges, said audio speaker being mounted in said conduit facing said fan and axially aligned with said hub.

23. The system of claim 22 including a discharge chamber into which said axially flow fan discharges, said discharge chamber having a lateral discharge opening and a laterally extending rear wall spaced from said fan beyond said lateral opening, and wherein said speaker is mounted in said laterally extending rear wall facing and axially aligned with said axial flow fan.

24. The system of claim 23 wherein said speaker is larger in lateral dimensions than said fan hub

* * * * *